Dec. 31, 1968 D. R. VON RECKLINGHAUSEN ET AL 3,419,811

AUDIO AMPLIFIER TONE CONTROL SYSTEM

Filed June 7, 1967

INVENTOR
DANIEL R. vonRECKLINGHAUSEN
LAWRENCE W. FISH, JR.

BY Rines and Rines

ATTORNEYS

United States Patent Office 3,419,811
Patented Dec. 31, 1968

3,419,811
AUDIO AMPLIFIER TONE CONTROL SYSTEM

Daniel R. von Recklinghausen, Arlington, and Lawrence W. Fish, Jr., Hudson, Mass., assignors to H. H. Scott, Inc., Maynard, Mass., a corporation of Massachusetts Filed June 7, 1967, Ser. No. 644,137
7 Claims. (Cl. 330—25)

ABSTRACT OF THE DISCLOSURE

The present invention relates to a novel audio amplifier tone control system that obviates the necessity for impedance transformation inputs and multiple transistor stages through the utilization of a field-effect transistor with critical DC negative feedback impedance values relative to the impedance of the input tone control network.

Figure 1:
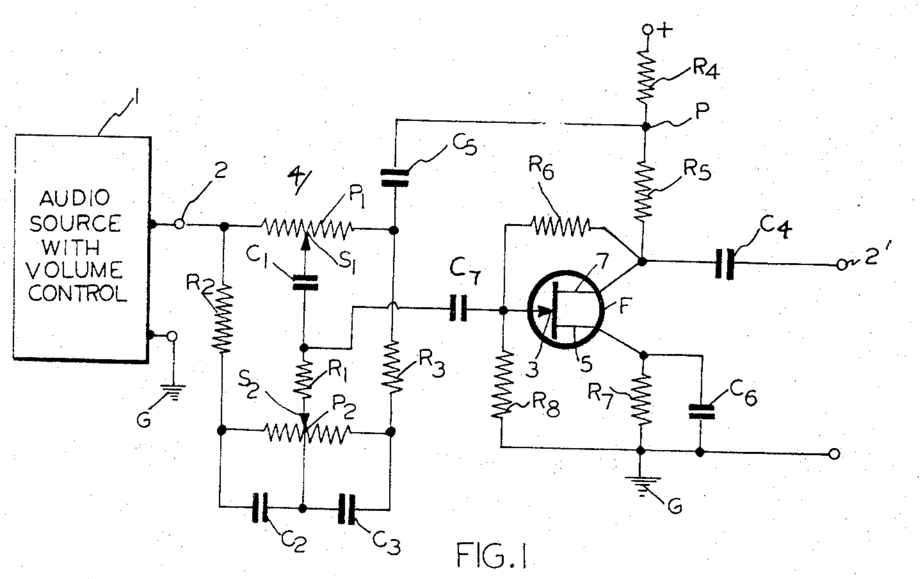

The present invention relates to audio amplifier tone control systems, and more particularly to audio amplifiers useful with boost and attenuate networks, commonly referred to as tone control circuits, which generally follow the volume control stages of an audio amplifier system; it being understood, however, that the novel features of the invention may also be useful in other types of circuits and frequency ranges, as well.

In such applications as audio amplifier tone control circuits, it has been conventional to follow the relatively high impedance volume control stage with an impedance transformation circuit in order to apply the audio signals to a tone control network that feeds the conventional plural-stage audio amplifier circuits. Because of the relatively low impedance of, for example, transistor audio amplifier circuits, however, relatively large electrolytic and other coupling and feedback capacitors are required in addition to the before-mentioned impedance transformation input circuit. Multiple transistor stages have been necessary, moreover, to achieve the desired gain.

While it has been known that field-effect transistors (FET) present higher impedance than ordinary transistors, it has not heretofore been considered feasible to employ such devices in circuits of the above-described character because of the known limitation that the noise of the field-effect transistors deteriorates at the lower frequencies. While field-effect transistors have been available designed for audio-frequency use and which have good noise characteristics at low frequencies, these particular field-effect transistors are most generally characterized by having low transconductance and therefore low gain. Field-effect transistors designed for high frequency operation, on the other hand, do and must have high transconductances in order to operate correctly at the high fequencies, but are not, as conventionally operated, suited for audio amplifier circuit applications. For the above reasons, therefore, it has not been considered feasible or desirable to try to replace the multiple audio amplifier transistor stages and impedance transformation circuits with field-effect transistor circuits.

In accordance with the present invention, however, a novel way of operating a field-effect transistor with rather critically designed relative impedance values between DC feedback paths and the input tone control network, as well as an appropriate AC feedback path, has, in summary, been found to enable highly advantageous use of a single field-effect transistor, for example, in substitution for the plurality of ordinary transistor audio amplifiers employed in such circuits, and without the necessity for impedance transformation, and with a surprising lack of deterioration of noise, contrary to the expectation resulting from the manufacturer's published characteristics of the field-effect transistor. The present invention, moreover, is not restricted to the novel use of low-frequency field-effect transistors, but includes, also, those high-frequency field-effect transistors with large available amplification as well.

An object of the invention, therefore, is to provide a new and improved audio amplifier system of the character described that obviates the necessity for the use of a plurality of transistor amplifier stages, eliminates the necessity for impedance transformation, greatly reduces the size requirement on capacitors and other electrical components, through the novel use of a field-effect transistor and a pair of DC negative feedback paths and an AC negative feedback path. The substantial avoidance of use of electrolytic capacitors, furthermore, has removed one of the major problems of leakage current inherent in electrolytic capacitors. Ceramic, paper, polyester dielectric, and other types of capacitors of substantially improved leakage characteristics can now be used without the disadvantage of large and cumbersome size and tendency for pickup of undesired alternating voltages.

Another factor that has heretofore contra-indicated the possible use of FET devices in this particular type of circuit resides in the large manufacturing variation (of 10:1 or more) in zero bias characteristics of field-effect transistors of the same design. With the critical circuit arrangement of the invention, no further penalty has been paid for additional selection to closer tolerances.

A further object is to provide a new and improved tone control circuit.

Other and further objects will be explained hereinafter and will be more particularly delineated in the appended claims.

Figure 2:
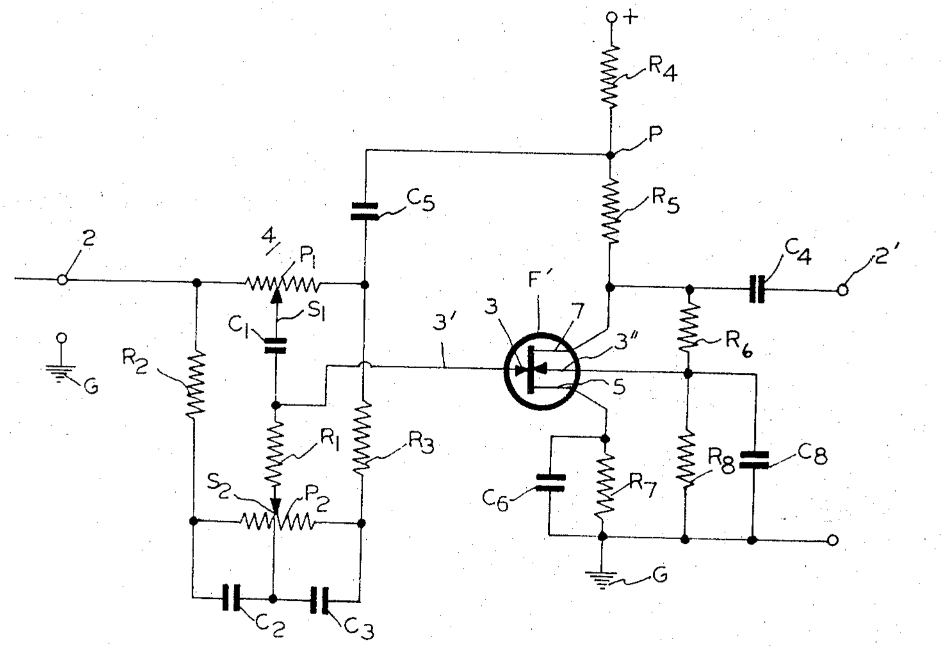

The invention will now be described in connection with the accompanying drawing, FIG. 1 of which is a schematic circuit diagram illustrating the invention in preferred form; and FIG. 2 is a similar diagram of a modification employing a different type of field-effect transistor.

A source 1 of, for example, audio signals, such as a conventional stage comprising a volume control, is schematically illustrated as feeding the input terminals 2 (one of which is shown grounded at G), shown directly connected to a boost and attenuate tone control network 4 comprising a treble control potentiometer P1 and a bass control potentiometer P2 connected with a frequency-selective summing network comprising resistor R1 and capacitor C1 which respectively interconnect with the sliders S1 and S2 of the potentiometers P1 and P2. The ends of the potentiometers P1 and P2 are shown connected together through resistors R2 and R3 which, in conjunction with capacitors C2 and C3 that respectively connect across different portions of the potentiometer P2, comprise the bass control network and further limit the amount of boost and attenuation desired in both the treble and bass controls, serving thus as an equalization and frequency response shaping network.

An N-channel field-effect transistor is shown at F comprising a gate electrode 3, a source electrode 5 and a drain electrode 7, the drain electrode being shown capacitively coupled by output circuit capacitor C4 to output terminals 2′ (one of which is shown grounded at G). Supply voltage for the drain electrode 7 is shown attained from the terminal + through the voltage divider resistors R4 and R5, from the intermediate connection P of which an AC negative feedback path is provided comprising capacitor C5 and connected to the right-hand terminal of potentiometer P1 of the input network 4. This AC feedback path reduces distortion and controls the amplification versus frequency characteristic of the transistors, as is well known.

In accordance with an important feature of the invention, it has been discovered that a pair of DC negative feedback paths of rather critical value relative to the impedance of the network 4 must be provided, shown respectively as comprising resistor R6 connected between the drain electrode 7 and the gate electrode 3, and resistors R7 and R8 connected to ground and to the source electrode 5 and the gate electrode 3, respectively. The feedback resistor R7 is shown bypassed by capacitor C6. The beneficial operation before described may be attained provided the impedance of the pair of DC negative feedback paths R6 and R7–8 is adjusted to have an impedance value considerably greater than that presented by the network 4 to the gate electrode 3. Under such circumstances, it has been found that the DC current flowing through the field-effect transistor F will be stabilized but without the disadvantageous results of introducing substantial additional AC feedback to the gate electrode 3 by way of the feedback path R6.

Typical useful values for the DC feedback path elements R6, R7–8, and the network elements 4 with, for example, a type 2N3823 field-effect transistor F may be R6=10 megohms, R8=3.9 megohms, R7=2.2 thousand ohms, P1 and P2 each 1 megohm, R2 and R3 each 100,000 ohms, R1=120 thousand ohms, and R4 and R5 equal respectively to 6.8 and 3.3 thousand ohms. Through the use of the present invention, capacitors C5 ad C7 no longer need be electrolytic capacitors, but may be 0.22 $\mu$f. and 0.02 $\mu$f. ceramic capacitors or paper or other similar capacitors. Capacitors C2 and C3 may have values of about 0.0068 $\mu$f, instead of ten times that value as is required when conventional transistor amplifiers are used. Capacitor C1 may have a value of 470 pf. instead of ten times the value, as is customary in ordinary transistor amplifier circuits of this character. Similar remarks apply to the values of capacitors C4 and C6, which may now have a value of about 10 $\mu$f. and may, if desired, be electrolytic. The output coupling capacitor C4 may have a value of several microfarads. The impedance of the DC feedback paths R6 and R7–R8 is thus in this example of the order of about 3 megohms as compared with the order of less than 300,000 ohms for the effective impedance of the network 4 as seen by the gate 3 of stage F; the ratio of impedances of the DC feedback paths to the network 4 thus being of the order of 10:1.

The use of direct voltage feedback from the drain electrode 7 of the field-effect transistor F by way of voltage divider resistors R6 and R8 to the gate electrode 3 of the field-effect transistor F and negative current feedback by way of source resistor R7, substantially reduces the direct current variations of the field-effect transistor, a value constant within $\pm 20\%$ typically being achieved when field-effect transistors with zero-bias drain currents ranging over 10:1 are used. High current field-effect transistors if thus used will operate at the higher limit of current, and the low current field-effect transistors will operate at the aforementioned lower value, i.e. about 20% lower than nominal. This reduced variation of current has the further benefit of stabilizing the open-circuit gain for alternating voltages without feedback. This is caused by the fact that high current field-effect transistors operating at a constant current exhibit a lower value of trans-conductance than low current field-effect transistors operating at the same current. By this means, field-effect transistors of high zero-bias current operating at a somewhat increased current than nominal will exhibit a higher transconductance which counteracts the lower inherent transconductance at the nominal current value.

In the modification of FIG. 2, a field-effect transistor F′ employing two gate electrodes 3 and 3″ is employed in a circuit of substantially identical function. Here the tone control network 4 is connected to gate electrode 3 directly at 3′ without passing through capacitor C7 of FIG. 1. The direct voltage feedback from drain electrode 7 is passed by way of voltage dividers R6 and R8 to the second gate electrode 3″. In order to avoid any and all alternating current feedback to the second gate electrode 3″, capacitor C8 is used to bypass all alternating voltages to ground G. The direct voltage control to gate 3″ thereby affects the total drain current of the field-effect transistor F′ and similarly controls the alternating current gain from gate electrode 3, as described for the three-electrode field-effect transistor F of FIG. 1. Again, the same relationship of impedances and other parameters obtain in FIG. 2 as in the system of FIG. 1, although somewhat lower impedance values of R6 and R8 can be used in view of the fact that all alternating voltage is bypassed by C8.

While the illustrated transistors F and F′ are N-channel field-effect transistors, the circuits will, however, work equally well with P-channel field-effect transistors though with a negative supply voltage. Furthermore, insulated-gate field-effect transistors rather than the junction field-effect transistors shown will result in the similar performance; it being understood that further modifications will also occur to those skilled in the art and all such are considered to fall within the spirit and scope of the invention as defined in the appended claims.

What is claimed is:

1. An amplifier system having, in combination, a source of AC signals, a control system comprising a field-effect transistor provided with gate, source and drain electrode means and input and output circuits, the input circuit comprising an equalization and freqeuncy response shaping control network connected between the source and the gate electrode means, an AC feedback path connected from the drain electrode means to the network to reduce distortion and to control the amplification-frequency characteristic of the transistor, and a pair of DC negative feedback paths connected respectively from the source and drain electrode means to the gate electrode means, the impedance of the DC feedback paths being greater than that of the network as presented to the gate electrode means in order to stabilize the DC flowing through the field-effect transistor without introducing unwanted additional AC feedback to the gate eletcrode means.

2. A system as claimed in claim 1 and in which the said source is a source of audio signals and the said control system comprises a tone control therefor.

3. A system as claimed in claim 1 and in which the ratio of impedance of the DC feedback paths to that of the network is of the order of substantially ten-to-one.

4. A system as claimed in claim 1 and in which the said source comprises a volume control circuit connected directly and without impedance transformation to the said input circuit.

5. A system as claimed in claim 1 and in which the said control network comprises a pair of potentiometers interconnected by a frequency-selective summing network in turn connected to said gate electrode means.

6. A system as claimed in claim 5 and in which the summing network is connected from an intermediate point thereof capacitively to said gate electrode means.

7. A system as clamed in claim 5 and in which the summing network is connected from an intermediate point thereof directly to said gate electrode means.

References Cited

Electronics: Oct. 31, 1966, p. 19, 330–38FE.

ROY LAKE, *Primary Examiner.*

JAMES B. MULLINS, *Assistant Examnier.*

U.S. Cl. X.R.

330—28, 31, 35, 38